(12) United States Patent
Choi et al.

(10) Patent No.: US 9,913,393 B2
(45) Date of Patent: Mar. 6, 2018

(54) MOBILE ENERGY STORAGE SYSTEM

(71) Applicant: LG CNS CO., LTD., Seoul (KR)

(72) Inventors: Dong Wook Choi, Seoul (KR); Dong Chul Ko, Seoul (KR); Sang Hyub Kim, Seoul (KR); Tae Hyoung Ryu, Seoul (KR); Byoung Seung Lee, Seoul (KR)

(73) Assignee: LG CNS CO., LTD., Seoul (KR)

( * ) Notice: Subject to any disclaimer, the term of this patent is extended or adjusted under 35 U.S.C. 154(b) by 430 days.

(21) Appl. No.: 14/596,116

(22) Filed: Jan. 13, 2015

(65) Prior Publication Data

US 2015/0343970 A1    Dec. 3, 2015

(30) Foreign Application Priority Data

Jun. 3, 2014    (KR) .................. 10-2014-0067566

(51) Int. Cl.
| | |
|---|---|
| *B60L 1/00* | (2006.01) |
| *B60L 3/00* | (2006.01) |
| *H02G 3/00* | (2006.01) |
| *H05K 7/14* | (2006.01) |
| *H01M 2/10* | (2006.01) |
| *H01M 10/42* | (2006.01) |
| *H02J 3/32* | (2006.01) |

(52) U.S. Cl.
CPC ........ *H05K 7/1432* (2013.01); *H01M 2/1077* (2013.01); *H01M 2/1083* (2013.01); *H01M 10/425* (2013.01); *H01M 2220/20* (2013.01); *H02J 3/32* (2013.01)

(58) Field of Classification Search
CPC .................................................. H05K 7/1432
USPC ............................................................ 307/9.1
See application file for complete search history.

(56) References Cited

U.S. PATENT DOCUMENTS

| | | | |
|---|---|---|---|
| 6,471,309 B1* | 10/2002 | Turner | A47B 53/02 211/162 |
| 2011/0128695 A1* | 6/2011 | Fang | G06F 1/187 361/679.34 |
| 2011/0304211 A1* | 12/2011 | Peterson | G06F 1/263 307/48 |
| 2012/0014040 A1* | 1/2012 | McGinn | H05K 7/1492 361/601 |
| 2012/0059527 A1* | 3/2012 | Beaston | H01M 10/441 700/295 |
| 2012/0197449 A1* | 8/2012 | Sanders | G05B 15/02 700/291 |
| 2014/0375272 A1* | 12/2014 | Johnsen | B60L 11/16 320/136 |

* cited by examiner

*Primary Examiner* — Lincoln Donovan
*Assistant Examiner* — Metasebia Retebo
(74) *Attorney, Agent, or Firm* — Lee, Hong, Degerman, Kang & Waimey

(57) ABSTRACT

An energy storage system is provided. The system includes an energy storage device including at least one battery module, a power adjuster that adjusts power of the energy storage device, a controller that controls the energy storage device and the power adjuster, a rack that accommodates the energy storage device, the power adjuster and the controller, the rack including at least one stationary coupler fixed to a movable unit and at least one support device that supports the energy storage system against the moveable unit.

19 Claims, 8 Drawing Sheets

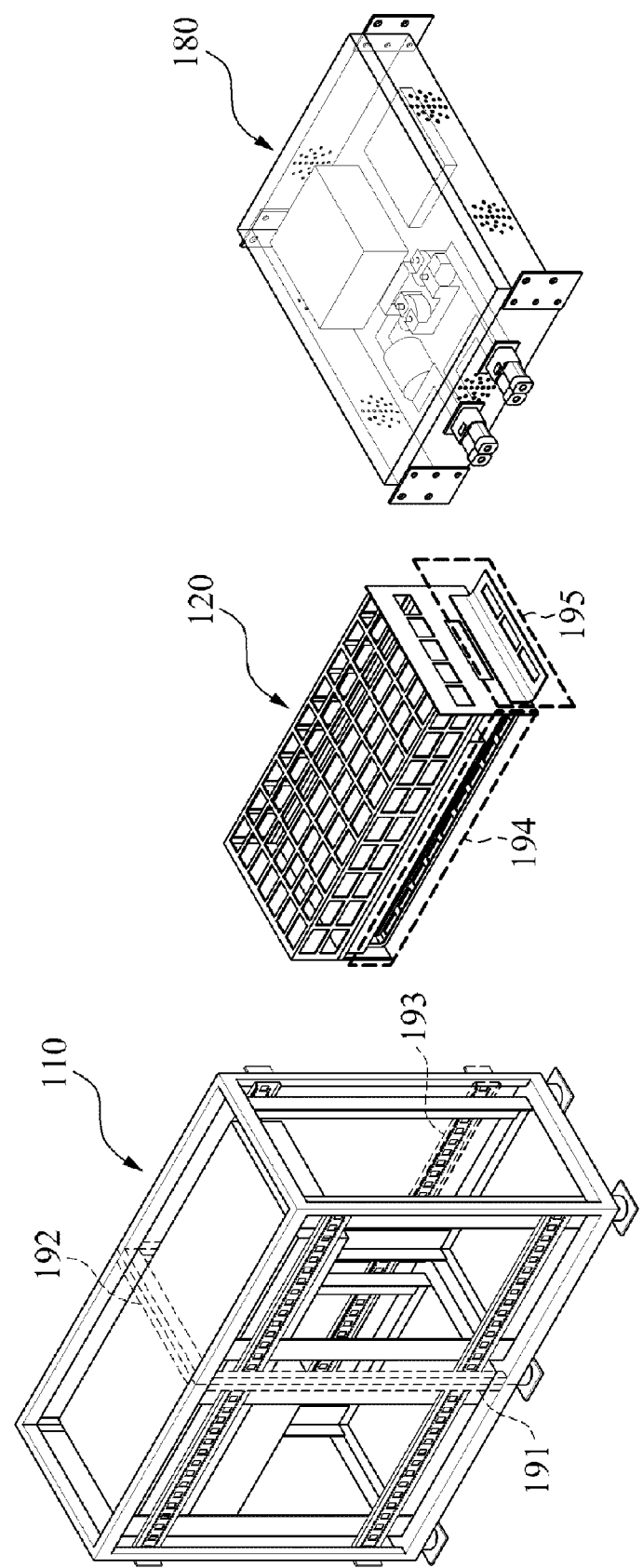

MOBILE ENERGY STORAGE SYSTEM

CROSS-REFERENCE TO RELATED APPLICATION

This application claims the benefit of earlier filing date and right of priority to Korean Patent Application No. 10-2014-0067566, filed on Jun. 3, 2014, the contents of which is incorporated by reference herein in its entirety.

FIELD OF THE INVENTION

The present invention relates to an energy storage system, and more particularly, to a mobile energy storage system.

DESCRIPTION OF THE RELATED ART

With an increase in energy consumption, technologies for efficiently using energy a under development. An example of such technology may include an energy storage system that may store a large amount of power as energy and supply the stored power to a load.

Korean Laid-Open Publication No. 10-2011-0062852 discloses an energy storage system that includes a plurality of battery packs connected between a system and a solar cell and configured to charge and discharge power. The energy storage system includes a bi-directional inverter connected to a grid between the battery packs and the solar cell and is configured to invert power from alternating current (AC) to direct current (DC) or from DC to AC, a converter connected to the solar cell between the battery packets and the grid and configured to convert a power of the solar cell, a plurality of bi-directional converters connected one-to-one to the battery packs between the solar cell and the grid and configured to convert a charge and discharge power of the battery pack, and a controller connected to and configured to apply a driving signal to the bi-directional inverter, the converter, and the bi-directional converters and to sequentially drive the bi-directional converters.

However, the disclosed energy storage system supplies energy in a stationary state and has disadvantages if provided in a mobile system. Accordingly, the energy storage system may be inappropriate for mounting to a movable unit to supply energy.

SUMMARY

In one aspect of the invention, an energy storage system is provided. The energy storage system includes an energy storage device comprising at least one battery module, a power adjuster configured to adjust power of the energy storage device, a controller configured to control the energy storage device and the power adjuster, a rack configured to accommodate the energy storage device, the power adjuster, and the controller, the rack comprising at least one stationary coupler fixed to a movable unit, and at least one support device configured to support the energy storage system against the movable unit.

It is contemplated that the at least one support device includes an anti-vibration device configured to couple to at least one damper for absorbing vibration of the movable unit. It is further contemplated that the at least one support device includes a caster configured to facilitate movement of the energy storage system with respect to the movable unit.

It is contemplated that an upper portion of the rack is configured to accommodate the power adjuster, a middle portion of the rack is configured to accommodate the controller and at a lower portion of the rack is configured to accommodate the energy storage device. It is further contemplated that a portion of the rack in which the power adjuster is accommodated is thermally isolated from the energy storage device and controller.

It is contemplated that the energy storage system further includes a ventilator configured to radiate a heat from the portion. It is further contemplated that the rack includes a ventilator for each of the at least one battery module.

It is contemplated that the energy storage system further includes a user interface exposed externally from the rack and including at least a charge outlet configured to change one of more of the at least one battery module, a discharge outlet configured to discharge power stored in one or more of the at least one battery module, a movable unit interface configured to communicate with the movable unit, an oil pressure interface configured to facilitate a specific function of the movable unit, a circuit breaker configured to cut-off power of the energy storage system or a charge state display configured to display a charge state of the energy storage device. It is further contemplated that the controller is further configured to establish a communication connection with the movable unit and transmit a control signal to the movable unit via the communication connection for controlling the movable unit.

It is contemplated that the control signal limits movement of the movable unit and comprises information indicating that one of more of the at least one battery module is being charged. It is further contemplated that the rack includes a first rack comprising a first stationary coupler fixed to the movable unit and configured to accommodate the energy storage device and the power adjuster and a second rack comprising a second stationary coupler fixed to the movable unit and configured to accommodate the controller.

It is contemplated that an upper end of the first rack is configured to accommodate the power adjuster and a lower end of the first rack is configured to accommodate the energy storage device. It is further contemplated that the energy storage system further includes a ventilator mounted to the first rack for each of the at least one battery module.

It is contemplated that the energy storage system further includes a user interface exposed externally from the second rack and including at least a charge outlet configured to change one of more of the at least one battery module, a discharge outlet configured to discharge power stored in one or more of the at least one battery module, a movable unit interface configured to communicate with the movable unit, an oil pressure interface configured to facilitate a specific function of the movable unit, a circuit breaker configured to cut-off power of the energy storage system or a charge state display configured to display a charge state of the energy storage unit device. It is further contemplated that the first rack and second rack are separate from each other and the energy storage system further includes a power line configured to connect the first rack to the second rack.

It is contemplated that the energy storage device includes a battery management system (BMS) configured to manage one or more of the at least one battery module. It is further contemplated that the BMS is further configured to provide at least a protection control function of the one or more of the at least one battery module, a lifecycle prediction control function of the one or more of the at least one battery module or a charge and discharge control function of the one or more of the at least one battery module.

It is contemplated that the movable unit is a vehicle, a ship or heavy equipment. It is further contemplated that the energy storage system provides energy to the movable unit for driving a specific function provided by the movable such that carbon emissions and noise generated by the specific function are reduced.

In another aspect of the present invention, an energy storage system is provided. The energy storage system includes an energy storage device including at least one battery module, a power adjuster configured to adjust power of the energy storage device, a controller configured to control a movable unit to which the energy storage system is attached, the energy storage device and the power adjuster, a rack configured to accommodate the energy storage device, the power adjuster, and the controller such that a portion of the rack in which the power adjuster is accommodated is thermally isolated from the energy storage device and controller, the rack including at least one stationary coupler fixed to the movable unit, at least one ventilator configured to radiate a heat from the isolated portion of the rack, a user interface exposed externally from the rack, and at least one support device configured to support the energy storage system against the movable unit.

BRIEF DESCRIPTION OF THE DRAWINGS

These and/or other aspects, features, and advantages of the invention will become apparent and more readily appreciated from the following description of embodiments, taken in conjunction with the accompanying drawings of which:

FIG. 3B illustrates integral structures of components of the energy storage system illustrated in FIG. 3A;

DETAILED DESCRIPTION

Figure 1:
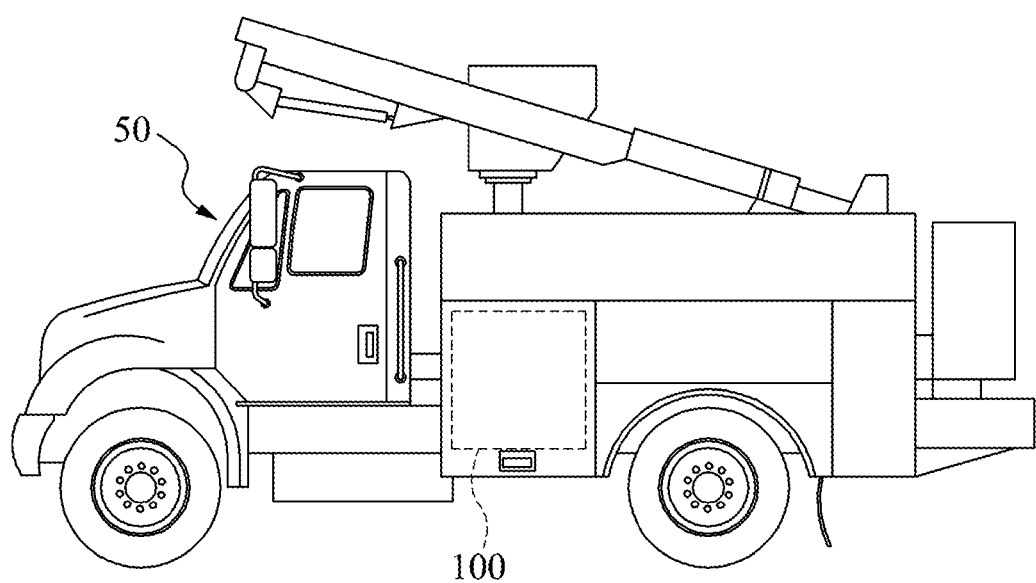
FIG. 1 illustrates an example of an energy storage system according to an embodiment of the present invention fixed to a movable unit.

Reference will now be made in detail to embodiments, examples of which are illustrated in the accompanying drawings, wherein like reference numerals refer to like elements throughout. Embodiments of the present invention are described by referring to the figures.

Various alterations and modifications may be made to the embodiments. The embodiments are not construed as limited to the disclosure and should be understood to include all changes, equivalents, and replacements within the idea and the technical scope of the disclosure.

The terminology used herein is for the purpose of describing particular embodiments only and is not intended to limit the embodiments. As used herein, the singular forms "a", "an", and "the" are intended to include the plural forms as well, unless the context clearly indicates otherwise. It will be further understood that the use of terms "include/comprise" and/or "have" specify the presence of stated features, integers, steps, operations, elements, components, and/or combinations thereof, but do not preclude the presence or addition of one or more other features, numbers, steps, operations, elements, components, and/or groups thereof.

Unless otherwise defined, all terms including technical and scientific terms used herein have the same meaning as commonly understood by one of ordinary skill in the art to which the present invention belongs. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the embodiments of the present invention with reference to the accompanying drawings, like reference numerals refer to like constituent elements and a repeated related description will be omitted. When it is determined that detailed description related to a known function or configuration may make the description and purpose of the embodiments unnecessarily ambiguous, the detailed description will be omitted.

FIG. 1 illustrates an example of an energy storage system according to an embodiment of the present invention fixed to a movable unit. A movable unit 50 and an energy storage system 100 are illustrated in FIG. 1.

The movable unit 50 may be a vehicle, a ship, or heavy equipment. The movable unit may provide a specific function such as a ladder truck, a camping car, a cold storage car, a sprinkler truck, a ready-mix truck, an excavator, a forklift, or a crane. The energy storage system 100 may supply the movable unit with energy for the specific function.

In the related art, fossil fuel has been used for energy of the movable unit 50. An engine of the movable unit must be operated in order to provide the corresponding specific function and, therefore, carbon emission and noise occur due to use of the fossil fuel. In addition, energy efficiency of the specific function is subordinate to the energy efficiency of the engine of the movable unit. Therefore, when the engine of the movable unit 50 has low energy efficiency, the corresponding specific function may also have low energy efficiency.

According to embodiments of the present invention, a specific function of the movable unit 50 is driven according to the energy storage system 100 and, therefore, carbon emission and noise generated by the specific function may be reduced. Also, the specific function may have high energy efficiency according to an increase in energy efficiency of the energy storage system.

Figure 2:
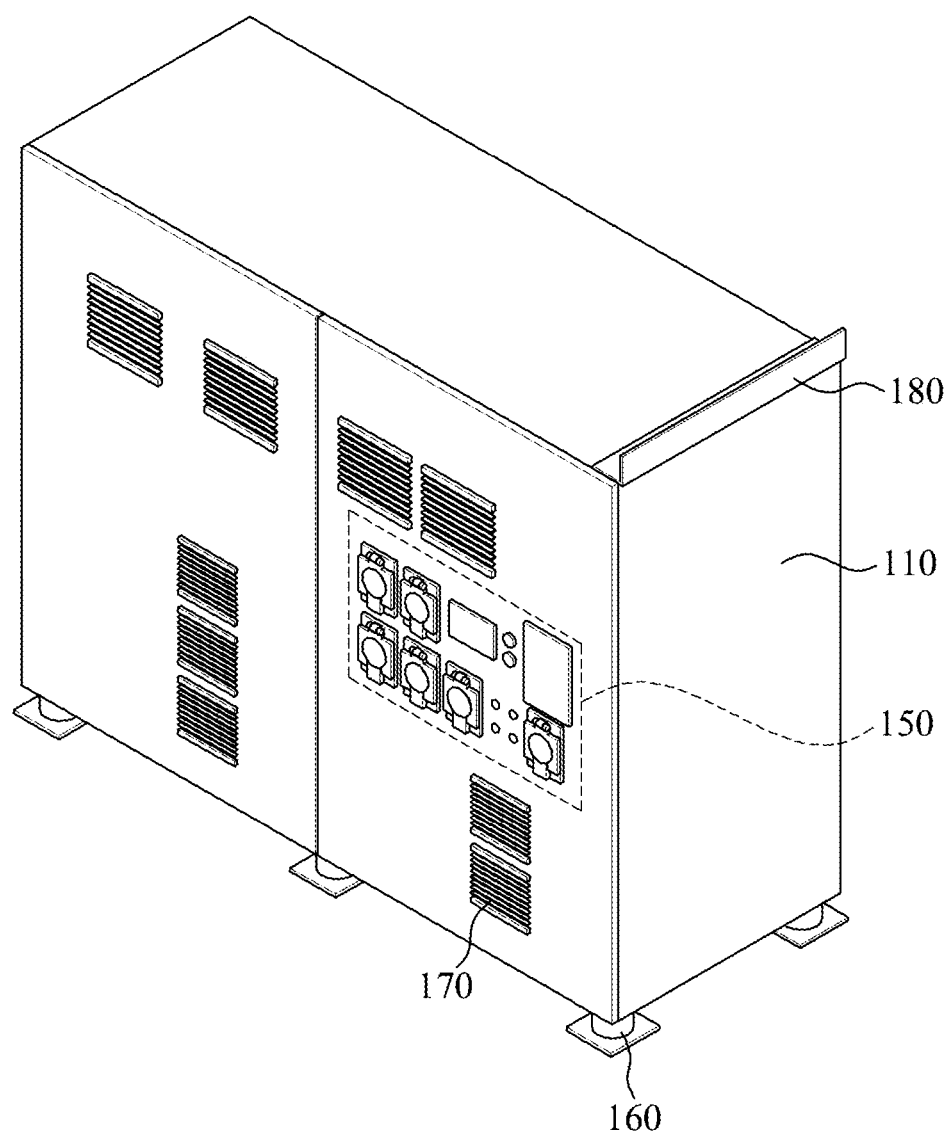
FIG. 2 is a perspective view of an energy storage system according to an embodiment of the present invention.

FIG. 2 is a perspective view of an energy storage system 100 according to an embodiment of the present invention. As illustrated in FIG. 2, the energy storage system 100 includes a rack 110, a user interface 150, supports 160, a ventilator 170, and a stationary coupler 180. The rack may be fixed to the movable unit via a stationary coupler.

Figure 3A:
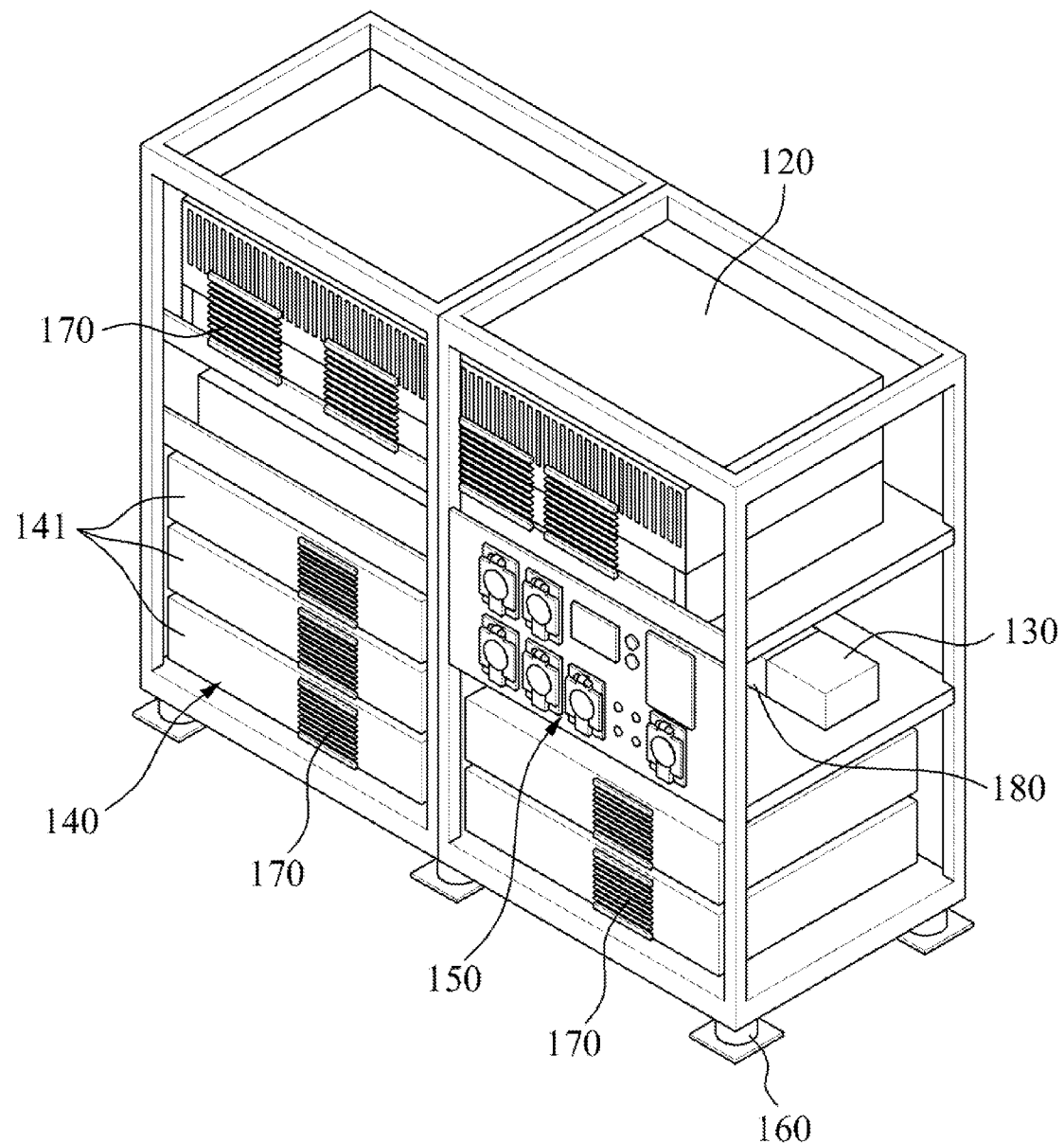
FIG. 3A illustrates an inner configuration of an energy storage system according to an embodiment of the present invention.

As illustrated in FIG. 3A, an upper end of the rack 110 may accommodate a power adjuster 120, a middle of the rack may accommodate a controller 130, and a lower end of the rack may accommodate an energy storage 140 unit. The illustrated structure of the rack may prevent or reduce vibration by lowering the centroid of the rack.

The rack 110 may include opened portions for the user interface 150 and the ventilator 170. The user interface may be externally exposed via the corresponding open portion. The ventilator 170 may radiate internal heat of the rack externally via the corresponding open portion.

The user interface 150 may include at least a charge outlet, a discharge outlet, a movable unit interface, an oil pressure interface, a circuit breaker, or a charge state display. A detailed description of the user interface will be provided with reference to FIG. 6.

The supports 160 provide support for the energy storage system 100 against the movable unit 50. Although not illustrated, the supports may include at least an anti-vibrator or a caster.

The anti-vibrator may couple with at least one damper (not shown) that is configured to absorb vibration from the movable unit 50. The anti-vibrator may be positioned between the stationary coupler 180 and the rack 110. The anti-vibrator may absorb vibration transferred between the stationary coupler and the rack.

The caster facilitates movement of the energy storage system 100, such as with respect to the movable unit 50. The caster may include a wheel, a principal axis, and an axle to facilitate the movement. The caster may also include a brake configured to maintain a stationary state of the energy storage system.

A ventilator 170 may be provided for each of at least one battery module 141 in order to suppress heat generation of the corresponding battery module. A ventilator 170 may also be provided for the power adjuster 120. Although not illustrated, the ventilator may include a filter positioned on one side of the power adjuster and a fan positioned on the opposite side of the filter. The ventilator may radiate internal heat of the rack 110 externally via an open portion of the rack.

The stationary coupler 180 fixes the rack 110 to the movable unit 50. For example, the stationary coupler may fix one side surface and a bottom surface of the rack to the movable unit. The anti-vibrator may be located between the stationary coupler and the rack to prevent or reduce vibration from the movable unit 50 from being transferred to the rack via the stationary coupler 180.

FIG. 3A illustrates an inner configuration of an energy storage system 100 according to an embodiment of the present invention. As illustrated in FIG. 3A, the energy storage system includes the power adjuster 120, the controller 130, and the energy storage 140 unit that includes at least one battery module 141. The energy storage system may also include a direct current (DC) box 182.

The power adjuster 120 adjusts power of the energy storage unit 140. The power adjuster may include a power conditioning system (PCS).

The power adjuster 120 may invert and convert power input to or output from the energy storage unit 140. The power adjuster may also provide surge protection for power of the energy storage unit.

The power adjuster 120 may convert DC power output from at least one battery module 141 to alternating power (AC) power and may transfer the converted AC power to a grid and a load. The power adjuster may also perform DC-AC bi-directional transmission by converting the converted AC power back to DC power and transferring the converted DC power to at least one battery module.

The power adjuster 120 may be accommodated in a space that is thermally isolated from the energy storage unit 140 and controller 130 within the rack 110. The power adjuster generates heat generator and, therefore, a ventilator 170 may be separately provided to radiate heat and to accommodate the power adjuster in a space isolated from other apparatuses. This structure may effectively reduce heat generated from the rack.

The controller 130 controls the power adjuster 120 and the energy storage unit 140. The controller may establish a communication connection with and control the power adjuster and energy storage unit via the communication connection. The communication connection may utilize a controller area network (CAN) protocol.

The controller 130 may control the user interface 150. The controller may establish a communication connection with and control the user interface via the communication connection. The controller may communicate with an oil pressure interface 154 of the user interface 150 using the CAN protocol and may communicate with a charge state display 156 of the user interface via a ModBus protocol.

The controller 130 may establish a communication connection with and transmit a control signal for controlling the movable unit 50 via the communication connection. The control signal may include information indicating that at least one battery module 141 is being charged and may limit movement of the movable unit.

The controller 130 may control the ventilator 170 for the power adjuster 120 and the energy storage 140 unit based on the temperature of the power adjuster and energy storage unit sensed by a sensor. The controller may be accommodated at a middle of the rack 110.

The energy storage unit 140 may include at least one battery module 141. The energy storage unit may also include a battery management system (BMS) configured to manage at least one battery module. The energy storage unit may be accommodated at a lower end of the rack 110.

The BMS may provide a protection control function of at least one battery module 141, a lifecycle prediction control function of at least one battery module, or a charge and discharge control function of at least one battery module. The BMS may control at least one battery module such that the battery module attains a maximum performance and may be safely used.

FIG. 3B illustrates integral structures of components of the energy storage system 100 illustrated in FIG. 3A. An integral structure of the rack 110 is illustrated on the left, an integral structure of the power adjuster 120 is illustrated in the middle, and an integral structure of a DC-box 182 is illustrated on the right.

The integral structure of the rack 110 illustrated on the left in FIG. 3B may have a frame from which structures 191, 192, and 193 used to support the rack 110 are removed. A PCS supporting shelf may also be removed and heights of a battery, a PCS, and a DC-box 182 may be reduced with of a cover of the rack having less thickness.

A bracket 194 and a support 195 of an integral structure of the power adjuster 120 are illustrated in the middle of FIG. 3B. The height of the power adjuster may be reduced and panels may be perforated such that the panels are lighter.

A top case and a lower case may be removed from the integral structure of DC-box 182 illustrated on the right of FIG. 3B. A shelf portion may be perforated such that it is lighter and a height of a case may be reduced.

The DC-box 182 may include a protection relay configured to protect the energy storage system 100. The DC-box may include a self start-up circuit. The self start-up circuit may drive the energy storage system with standby power stored in at least one battery module 141 instead of using commercial power. The DC-box may be located in at least one battery module or may be located in the power adjuster 120.

Figure 4:
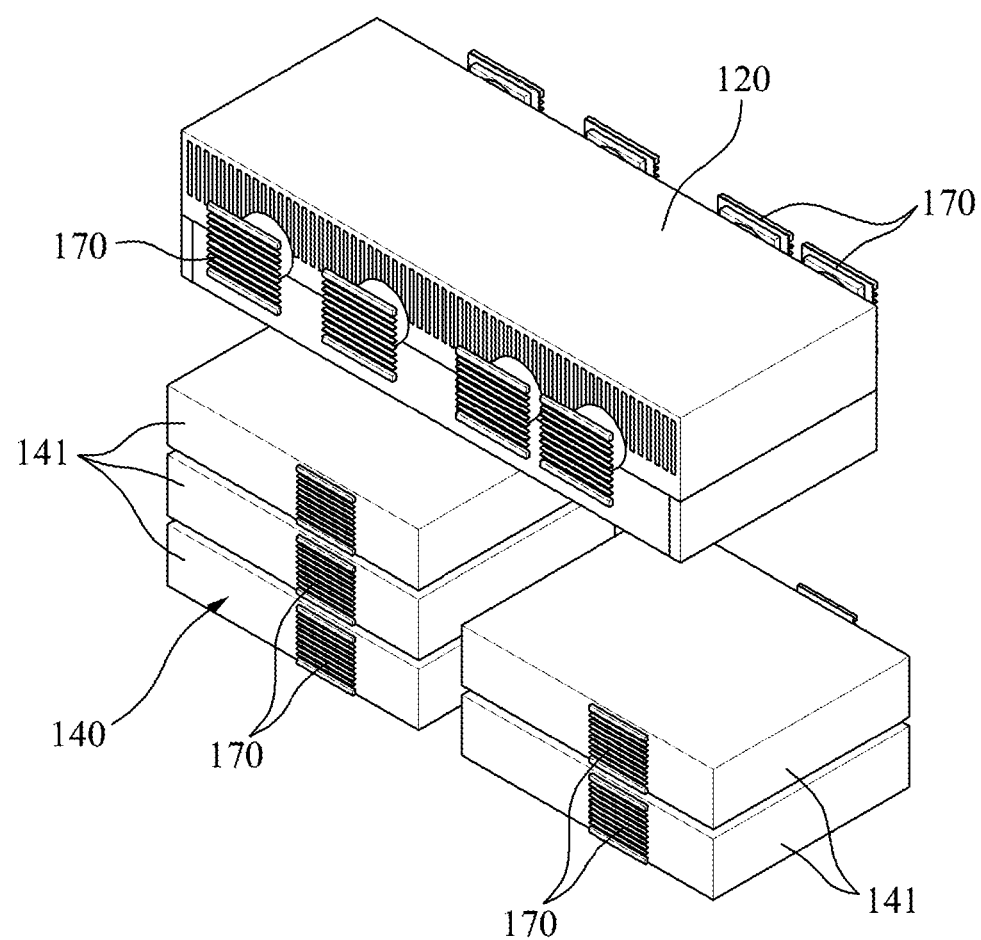
FIG. 4 is a perspective of an arrangement of a power adjuster of an energy storage system according to an embodiment of the present invention.

FIG. 4 is a perspective of an arrangement of a power adjuster 120 of an energy storage system 100 according to an embodiment of the present invention. FIG. 4 separately illustrates the power adjuster and the energy storage unit 140 within the energy storage system illustrated in FIG. 3A.

As illustrated in FIG. 4, the power adjuster 120 is accommodated in a space thermally isolated from the energy storage unit 140 that includes at least one battery module 141. The ventilator 170 may externally radiate heat from the thermally isolated space.

Figure 5:
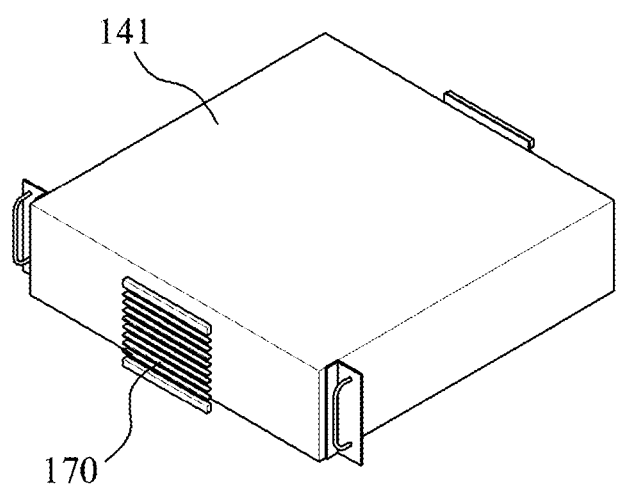
FIG. 5 is a perspective of a battery module of an energy storage system according to an embodiment of the present invention.

FIG. 5 is a perspective of a battery module 141 of an energy storage system 100 according to an embodiment of the present invention. FIG. 5 illustrates a battery module and a ventilator 170 mounted to the battery module.

Figure 6:
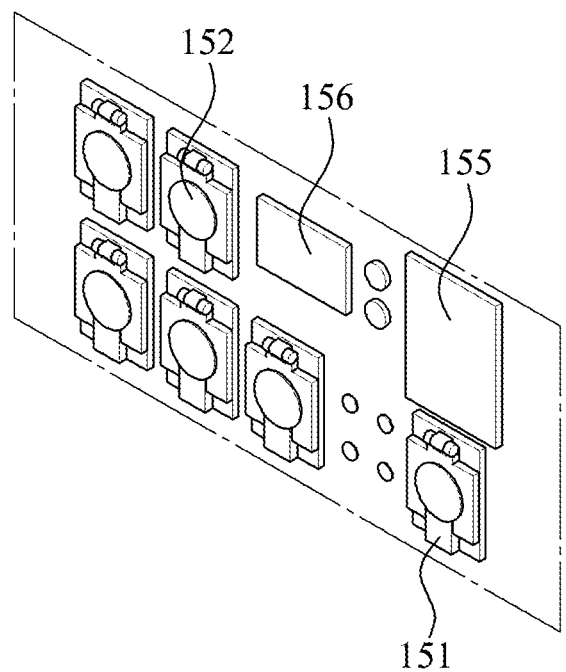
FIG. 6 illustrates a user interface of an energy storage system according to an embodiment of the present invention.
Figure 6:
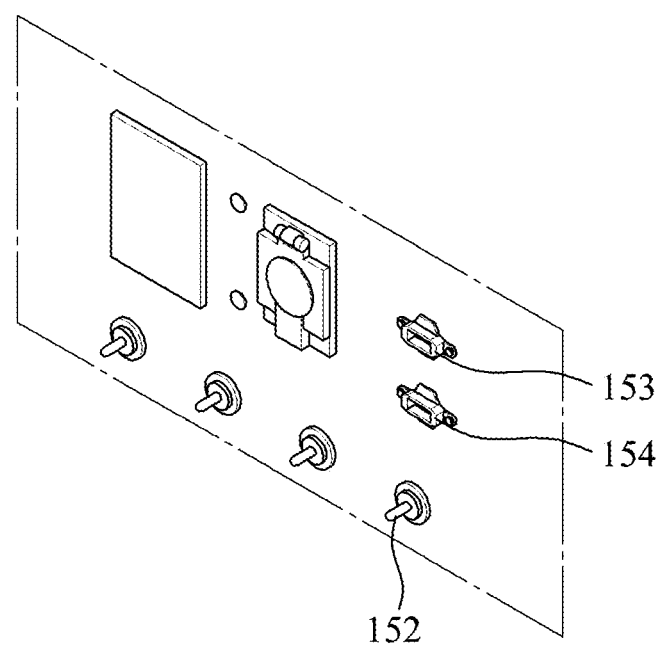

FIG. 6 illustrates a user interface 150 of an energy storage system 100 according to an embodiment of the present invention. As illustrated in FIG. 6, the user interface may include a charge outlet 151, a discharge outlet 152, a movable unit interface 153, an oil pressure interface 154, a circuit breaker 155, and a charge state display 156.

The charge outlet 151 is configured to charge at least one battery module 141 of the energy storage unit 140. The charge outlet may provide an outlet for voltage and current corresponding to at least one battery module. For example, the charge outlet may include a 120V/20 A outlet.

The discharge outlet 152 is configured to discharge power stored in at least one battery module 141 of the energy storage unit 140. The discharge outlet 152 may include at least 120V/20 A outlet, a 120V/40 A outlet, a DC 48V/250 A outlet, or a DC 12V/200 A outlet.

The movable unit interface 153 is for communicating with the movable unit 50. The energy storage system 100 may transfer a control signal to the movable unit via the movable unit interface. For example, when at least one battery module 141 is being charged, the energy storage system may transmit a movement limit control signal to the movable unit via the movable unit interface.

The oil pressure interface 154 is for a specific function of the movable unit 50 operating with oil pressure. The energy storage system 100 may control the specific function of the movable unit via the oil pressure interface.

The circuit breaker 155 is for cutting off a power of the energy storage system 100 in a required situation. The charge state display 156 may display a charge state of the energy storage unit 140 received from the controller 130.

Figure 7A:
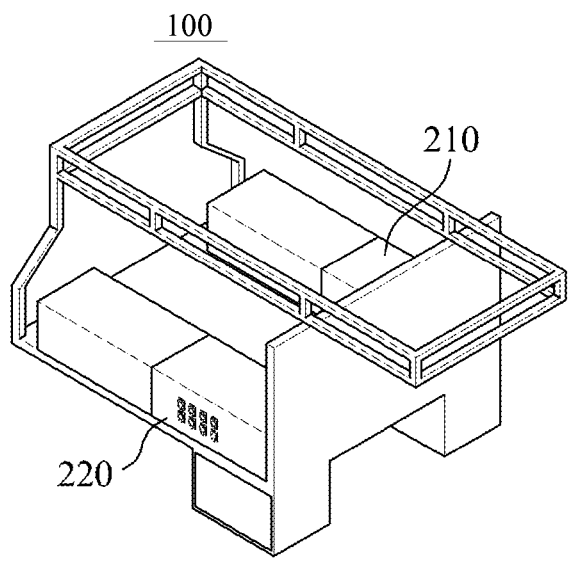
FIGS. 7A and 7B illustrate an energy storage system according to an embodiment of the present invention separated into a first rack and a second rack for installation.
Figure 7B:
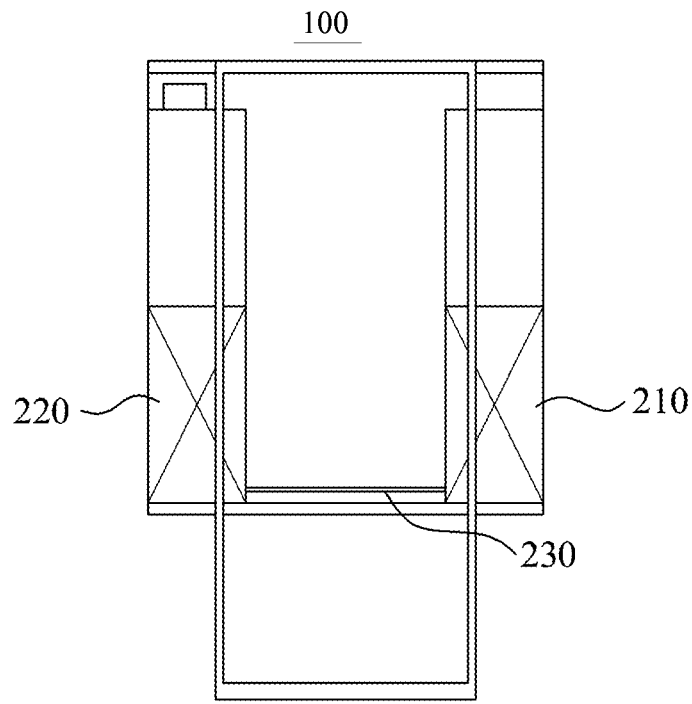

FIGS. 7A and 7B illustrate an energy storage system 100 according to an embodiment of the present invention separated into a first rack 210 and a second rack 220 for installation. FIG. 7A illustrates a perspective view of the installed first rack and second rack and FIG. 7B illustrates a top view of the installed first rack and second rack.

The first rack 210 may accommodate the power adjuster 120 and the energy storage unit 140. The first rack may include the power adjuster at an upper end and may include the energy storage unit at a lower end. The first rack may be fixed to the movable unit 50 via a first stationary coupler 180. A power line 230 is mounted to the movable unit 50.

The power adjuster 120 may be accommodated in a space thermally isolated from the energy storage 140 unit. A ventilator 170 for externally radiating heat of the isolated space may be installed. The ventilator may be mounted to the first rack 210.

The second rack 220 may accommodate the controller 130 and the user interface 150. The user interface may include at least the charge outlet 151, the discharge outlet 152, the movable unit interface 153, the oil pressure interface 154, the circuit breaker 155, or the charge state display 156. The user interface may be exposed externally from the second rack.

The second rack 220 may be fixed to the movable unit 50 via a second stationary coupler 180. For example, the first rack 210 may be fixed to a first area of the movable unit and the second rack may be fixed to a separate second area of the movable unit.

The first rack 210 and the second rack 220 may be connected to an anti-vibrator configured to couple with at least one damper for absorbing vibration from the movable unit 50. The anti-vibrator may be installed between the first stationary coupler 180 of the first rack and the movable unit and between the second stationary coupler of the second rack and the movable unit.

The power line 230 transfers power between the first rack 210 and the second rack 220. For example, the power line may transfer power of the energy storage unit 140 included in the first rack to the user interface 150 included in the second rack.

According to the disclosed example embodiments, an energy storage system is provided that is fixed to a movable unit in order to stably supply energy to the movable unit.

According to the disclosed example embodiments, a structure of an energy storage system is provided for preventing or decreasing vibration occurring in response to movement.

According to the disclosed example embodiments, a structure for radiating heat generated by an energy storage system is provided.

The disclosed embodiments of the present invention may be recorded in non-transitory computer-readable media including program instructions to implement various operations embodied by a computer. The media may also include, alone or in combination with the program instructions, data files, data structures, and the like.

Examples of non-transitory computer-readable media include magnetic media such as hard disks, floppy disks, and magnetic tape; optical media such as CD ROM disks and DVDs; magneto-optical media such as floptical disks; and hardware devices that are specifically configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described embodiments, or vice versa.

Although example embodiments of the present invention have been illustrated and described, the present invention is not limited to the disclosed embodiments. It will be appreciated by those skilled in the art that changes may be made to the disclosed embodiments without departing from the principles and spirit of the present invention, the scope of which is defined by the claims and their equivalents.

What is claimed is:

1. An energy storage system comprising:
    an energy storage device comprising at least one battery module;
    a power adjuster configured to adjust power of the energy storage device;
    a controller configured to control the energy storage device and the power adjuster;
    a rack comprising at least one stationary coupler fixed to a vehicle and configured to accommodate the energy storage device, the power adjuster and the controller; and at least one support device configured to support the energy storage system against the vehicle, wherein the energy storage device provides energy for a specific function of the vehicle other than a driving function of the vehicle, and wherein the controller establishes a communication connection with the vehicle and transmits a control signal to the vehicle via the communication connection for controlling the specific function of the vehicle.

2. The energy storage system of claim 1, wherein the at least one support device comprises an anti-vibration device configured to couple to at least one damper for absorbing vibration of the vehicle.

3. The energy storage system of claim 1, wherein the at least one support device comprises a caster configured to facilitate movement of the energy storage system with respect to the vehicle.

4. The energy storage system of claim 1, wherein:
an upper portion of the rack is configured to accommodate the power adjuster;
a middle portion of the rack is configured to accommodate the controller; and
at a lower portion of the rack is configured to accommodate the energy storage device.

5. The energy storage system of claim 1, wherein a portion of the rack in which the power adjuster is accommodated is thermally isolated from the energy storage device and controller.

6. The energy storage system of claim 5, further comprising:
at least one ventilator configured to radiate heat from the isolated portion.

7. The energy storage system of claim 1, the rack further comprises:
a ventilator for each of the at least one battery module.

8. The energy storage system of claim 1, further comprising a user interface exposed externally from the rack and including at least:
a charge outlet configured to change one or more of the at least one battery module;
a discharge outlet configured to discharge power stored in one or more of the at least one battery module;
a vehicle interface configured to communicate with the vehicle;
an oil pressure interface configured to facilitate a specific function of the vehicle;
a circuit breaker configured to cut-off power of the energy storage system; or
a charge state display configured to display a charge state of the energy storage device.

9. The energy storage system of claim 1, wherein the control signal limits movement of the vehicle and includes information indicating that one or more of the at least one battery module is being charged.

10. The energy storage system of claim 1 wherein the rack further comprises:
a first rack comprising a first stationary coupler fixed to the vehicle and configured to accommodate the energy storage device and the power adjuster; and
a second rack comprising a second stationary coupler fixed to the vehicle and configured to accommodate the controller.

11. The energy storage system of claim 10, wherein:
an upper end of the first rack is configured to accommodate the power adjuster; and
a lower end of the first rack is configured to accommodate the energy storage device.

12. The energy storage system of claim 10, further comprising:
at least one ventilator mounted to the first rack for each of the at least one battery module.

13. The energy storage system of claim 10, further comprising:
a user interface exposed externally from the second rack and including at least:
a charge outlet configured to change one or more of the at least one battery module;
a discharge outlet configured to discharge power stored in one or more of the at least one battery module;
a vehicle interface configured to communicate with the vehicle;
an oil pressure interface configured to facilitate a specific function of the vehicle;
a circuit breaker configured to cut-off power of the energy storage system; or
a charge state display configured to display a charge state of the energy storage unit device.

14. The energy storage system of claim 13, wherein the first rack and second rack are separate from each other and further comprising:
a power line configured to connect the first rack to the second rack.

15. The energy storage system of claim 1, wherein the energy storage device further comprises a battery management system (BMS) configured to manage one or more of the at least one battery module.

16. The energy storage system of claim 15, wherein the BMS is further configured to provide at least:
a protection control function of the one or more of the at least one battery module;
a lifecycle prediction control function of the one or more of the at least one battery module; or
a charge and discharge control function of the one or more of the at least one battery module.

17. The energy storage system of claim 1, wherein the vehicle comprises a vehicle, a ship or heavy equipment.

18. The energy storage system of claim 1, wherein the energy storage device further provides energy to the vehicle for driving the specific function such that carbon emissions and noise generated by the specific function are reduced.

19. An energy storage system comprising:
an energy storage device comprising at least one battery module;
a power adjuster configured to adjust power of the energy storage device;
a controller configured to control a vehicle to which the energy storage system is attached, the energy storage device and the power adjuster;
a rack comprising at least one stationary coupler fixed to the vehicle and configured to accommodate the energy storage device, the power adjuster, and the controller such that a portion of the rack in which the power adjuster is accommodated is thermally isolated from the energy storage device and controller;
at least one ventilator configured to radiate heat from the isolated portion of the rack;
a user interface exposed externally from the rack; and
at least one support device configured to support the energy storage system against the vehicle,
wherein the energy storage device provides energy for a specific function of the vehicle other than a driving function of the vehicle, and
wherein the controller establishes a communication connection with the vehicle and transmits a control signal to the vehicle via the communication connection for controlling the specific function of the vehicle.

\* \* \* \* \*